United States Patent
Abraham et al.

(10) Patent No.: US 7,611,911 B2
(45) Date of Patent: Nov. 3, 2009

(54) METHOD AND SYSTEM FOR PATTERNING OF MAGNETIC THIN FILMS USING GASEOUS TRANSFORMATION TO TRANSFORM A MAGNETIC PORTION TO A NON-MAGNETIC PORTION

(75) Inventors: David William Abraham, Croton-on-Hudson, NY (US); Eugene John O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 10/680,260

(22) Filed: Oct. 8, 2003

(65) Prior Publication Data

US 2005/0079647 A1   Apr. 14, 2005

(51) Int. Cl.
*H01L 21/00* (2006.01)
*G11B 5/64* (2006.01)
(52) U.S. Cl. ............ 438/3; 257/E21.663; 428/694 TF
(58) Field of Classification Search ............ 438/3; 257/E21.663; 428/694 TF
See application file for complete search history.

(56) References Cited

U.S. PATENT DOCUMENTS

| | | | | |
|---|---|---|---|---|
| 4,411,757 A | * | 10/1983 | Kitada et al. ............ 204/192.34 |
| 4,536,520 A | * | 8/1985 | Mueller ............ 521/89 |
| 6,024,885 A | * | 2/2000 | Pendharkar et al. ............ 216/22 |
| 6,093,659 A | * | 7/2000 | Grider et al. ............ 438/758 |
| 6,165,803 A | * | 12/2000 | Chen et al. ............ 438/3 |
| 6,168,845 B1 | * | 1/2001 | Fontana et al. ............ 428/836 |
| 6,174,737 B1 | | 1/2001 | Durlam et al. |
| 6,296,777 B1 | * | 10/2001 | Engelhardt et al. ............ 216/40 |
| 6,331,364 B1 | | 12/2001 | Baglin et al. |
| 6,383,597 B1 | | 5/2002 | Fullerton et al. |
| 6,383,598 B1 | * | 5/2002 | Fullerton et al. ............ 428/830 |
| 6,391,430 B1 | * | 5/2002 | Fullerton et al. ............ 428/212 |
| 6,440,520 B1 | * | 8/2002 | Baglin et al. ............ 428/65.3 |
| 6,567,299 B2 | | 5/2003 | Kunikiyo et al. |
| 6,798,004 B1 | * | 9/2004 | Grynkewich et al. ............ 257/295 |
| 6,841,224 B2 | * | 1/2005 | Kamata et al. ............ 428/164 |
| 6,849,349 B2 | * | 2/2005 | Klemmer et al. ............ 428/694 T |
| 6,881,351 B2 | * | 4/2005 | Grynkewich et al. ............ 435/135 |
| 2002/0098676 A1 | * | 7/2002 | Ning et al. ............ 438/622 |

(Continued)

FOREIGN PATENT DOCUMENTS

JP   2001-167432   6/2001

(Continued)

OTHER PUBLICATIONS

Bruenger et al., "Ion projection lithography for resistless patterning of thin magnetic films", 25th International Conference on Micro and Nano Engineering, Rome Italy, Sep. 21-23, 1999 and Microelectron. Eng. (Netherlands), vol. 53, No. 1-4, Jun. 2000, pp. 605-608.

(Continued)

*Primary Examiner*—Anh D Mai
(74) *Attorney, Agent, or Firm*—McGinn IP Law Group, PLLC; Yazken A. Alexanian

(57) ABSTRACT

A method (and resulting structure) of patterning a magnetic thin film, includes using a chemical transformation of a portion of the magnetic thin film to transform the portion to be non-magnetic and electrically insulating.

17 Claims, 3 Drawing Sheets

U.S. PATENT DOCUMENTS

| | | | |
|---|---|---|---|
| 2002/1014219 | * 10/2002 | Kamata et al. | 428/694 T |
| 2003/0113524 A1 | 6/2003 | Klemmer et al. | |
| 2003/0219944 A1 | 11/2003 | Kato et al. | |
| 2003/0224608 A1* | 12/2003 | Lee et al. | 438/694 |
| 2004/0205958 A1* | 10/2004 | Grynkewich et al. | 29/603.14 |
| 2005/0002229 A1* | 1/2005 | Matsutera et al. | 365/171 |

FOREIGN PATENT DOCUMENTS

| | | |
|---|---|---|
| JP | 2001-250217 | 9/2001 |
| JP | 2002-359138 | 12/2002 |
| TW | 466486 B | 12/2001 |
| TW | 548656 B | 8/2003 |

OTHER PUBLICATIONS

Eugene Chen, et al., "Magnetic tunnel junction pattern technique", Silicon Magnetic Systems, Cypress Semiconductor, San Jose, CA, Journal of Applies Physics, vol. 93, No. 10, May 15, 2003, p. 8379.

B.D. Terris et al., "Patterning magnetic films by ion beam irradiation", J. Appl. Phys., (USA), vol. 87, No. 9, Pt. 1-3, May 1, 2000, pp. 7004-7006.

Corporate Associates, "Physics Helps Redesign Dow Chemical," 39 The Industrial Physicst, Apr. 1999, American Institute of Physics, p. 1.

Taiwanese Search Report conducted Jan. 3, 2009, and partial English translation of Search Report.

Taiwanese Office Action dated Mar. 5, 2009.

* cited by examiner

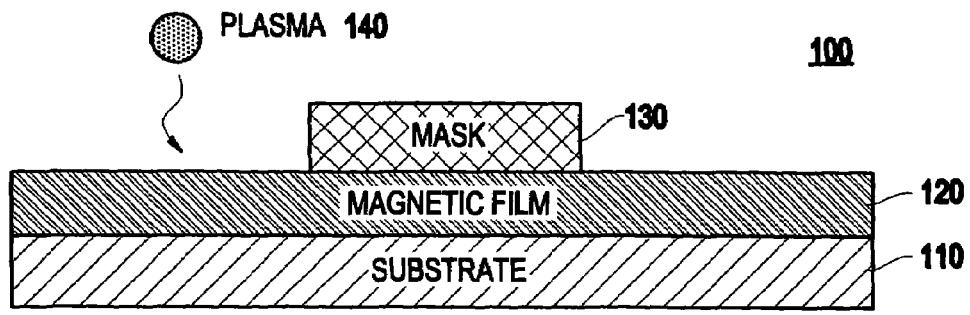
FIG. 1
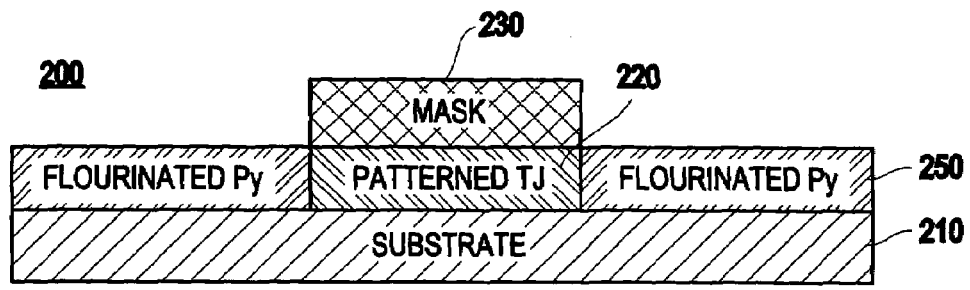
FIG. 2A (FLOURINATION)
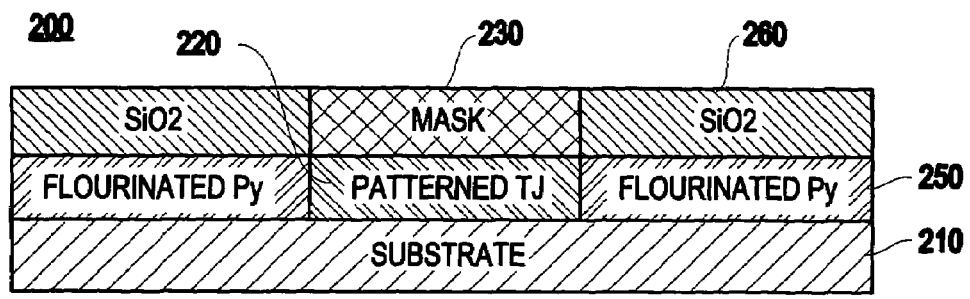
FIG. 2B (PASSIVATION)
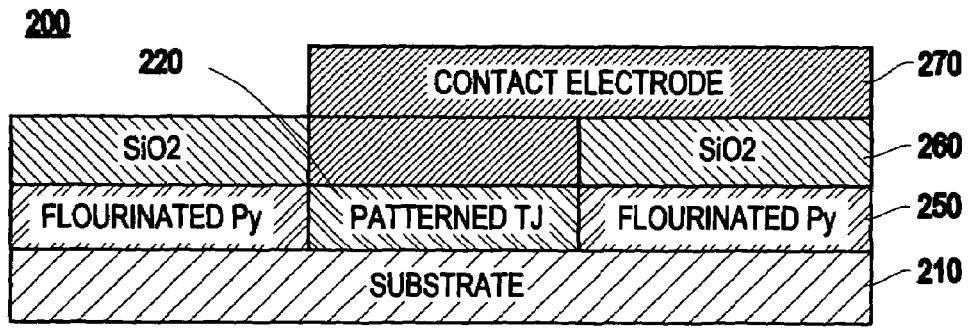
FIG. 2C (CONTACT)

METHOD AND SYSTEM FOR PATTERNING OF MAGNETIC THIN FILMS USING GASEOUS TRANSFORMATION TO TRANSFORM A MAGNETIC PORTION TO A NON-MAGNETIC PORTION

U.S. GOVERNMENT RIGHTS IN THE INVENTION

The subject matter of the present Application was at least partially funded under Contract No. MDA972-99-C-0009 from the U.S. Defense Advanced Research Projects Agency (DARPA).

BACKGROUND OF THE INVENTION

1. Field of the Invention

The present invention generally relates to a method and system for patterning of thin films, and more particularly to a method and system for patterning magnetic thin films using gaseous transformation.

2. Description of the Related Art

Patterning of thin magnetic films for application in various sensors and devices, such as thin-film disk drive read heads and magnetic memory elements, has relied on removal (e.g., physical removal) of material by reactive ion etching (RIE), ion milling and other subtractive techniques.

Hence, these methods use physical removal of material in order to delineate a region both magnetically and electrically. Typically, the region to be patterned is of micron or submicron dimension, and often sensitivity to edge roughness, profile and redeposited material determines the quality of the final product.

Recently, experiments (e.g., see W. H. Bruenger et al., "Ion Projection Lithography for Resistless Patterning of Thin Magnetic Films", 25th International Conference on Micro and Nano Engineering, Rome, Italy, 21-23 Sep. 1999 and Microelectronics Engineering (Netherlands) Vol. 53, No. 1-4, June 2000, pp. 605-608; and B. D. Terris et al., "Patterning Magnetic Films by Ion Beam Irradiation", Journal of Applied Physics (USA), Volume 87, No. 9 pt. 1-3, 1 May 2000, pp. 7004-7006) have used ion beams to pattern (e.g., by damage and by implantation) without physical removal of material. Specifically, such a method has used an oxygen implantation technique. However, prior to the invention, such a technique has not been applied to magnetic memory devices.

In the case of magnetic memory (MRAM) structures, patterning of the tunneling junction device as discussed above is of utmost importance in achieving final success and a high-performance product.

Mainly, the failure of the final product is due to non-uniformity of magnetic switching properties in the potentially millions of junctions on a memory chip. This variability is traced to many different factors, but one of the most important is in the patterning process. Gross differences in shape lead to a variation in the magnetic switching field. Also, edge roughness is known to cause variation due to edge pinning of magnetization.

Finally, magnetic hardening of the edges due to oxidation, edge thinning, and magnetic effects due to redeposited material each influence magnetic performance. In all of the patterning methods in which removal of material is used (e.g., ion milling, reactive ion etching (RIE), etc.), the edges of the patterned area are compromised in at least one of these ways.

Thus, ion-beam patterning (as opposed to ion milling) offers significant promise for improved performance but remains unproven.

However, as mentioned above, while the conventional methods may have attempted oxygen implantation for oxidation patterning, such has not been attempted with MRAM devices, nor has there been any patterning of MRAM devices by exposure to a reactive plasma, let alone by using fluorination.

SUMMARY OF THE INVENTION

In view of the foregoing and other exemplary problems, drawbacks, and disadvantages of the conventional methods and structures, an exemplary feature of the present invention is to provide a method (and resulting structure) in which patterning of thin magnetic films is performed without physical removal of the thin magnetic film material of interest.

Another exemplary feature of the present invention is to provide a method (and structure) for patterning thin magnetic films by converting (e.g., chemically) selective portions of the magnetic thin film material to a non-magnetic and/or insulating state.

Yet another feature of the present invention is to provide a method (and structure) which uses fluorination in the conversion of the magnetic film.

In a first exemplary aspect of the present invention, a method (and resulting structure) of patterning a magnetic thin film, includes using a chemical transformation of a portion of the magnetic thin film to transform the portion to be non-magnetic and electrically insulating.

In a second exemplary aspect, a magnetic thin film, includes a patterned magnetic tunnel junction (MTJ), and a fluorinated, non-magnetic, electrically insulating member formed on first and second sides of the patterned MTJ.

In a third exemplary aspect, a magnetic device includes the above-described magnetic thin film of the second aspect, and a conductive member (e.g., metal such as copper or the like) coupled to the patterned MTJ.

With the unique and unobvious features of the invention, selective low power plasma conversion can be performed for patterning magnetic thin films of MRAM devices, by exposing selective portions of the magnetic thin films to a reactive plasma.

Additionally, with the invention, there will be no fencing or redeposition material required. Thus, no shorting will be required for the top and bottom layers of the tunnel junction. Further, there will be little or no topography issues.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1 illustrates a structure 100 for being patterned according to an exemplary embodiment of the present invention;

FIGS. 2A-2C illustrate processing steps of a method 200 for patterning thin films according to the present invention;

DETAILED DESCRIPTION OF EXEMPLARY EMBODIMENTS OF THE INVENTION

Figure 3:
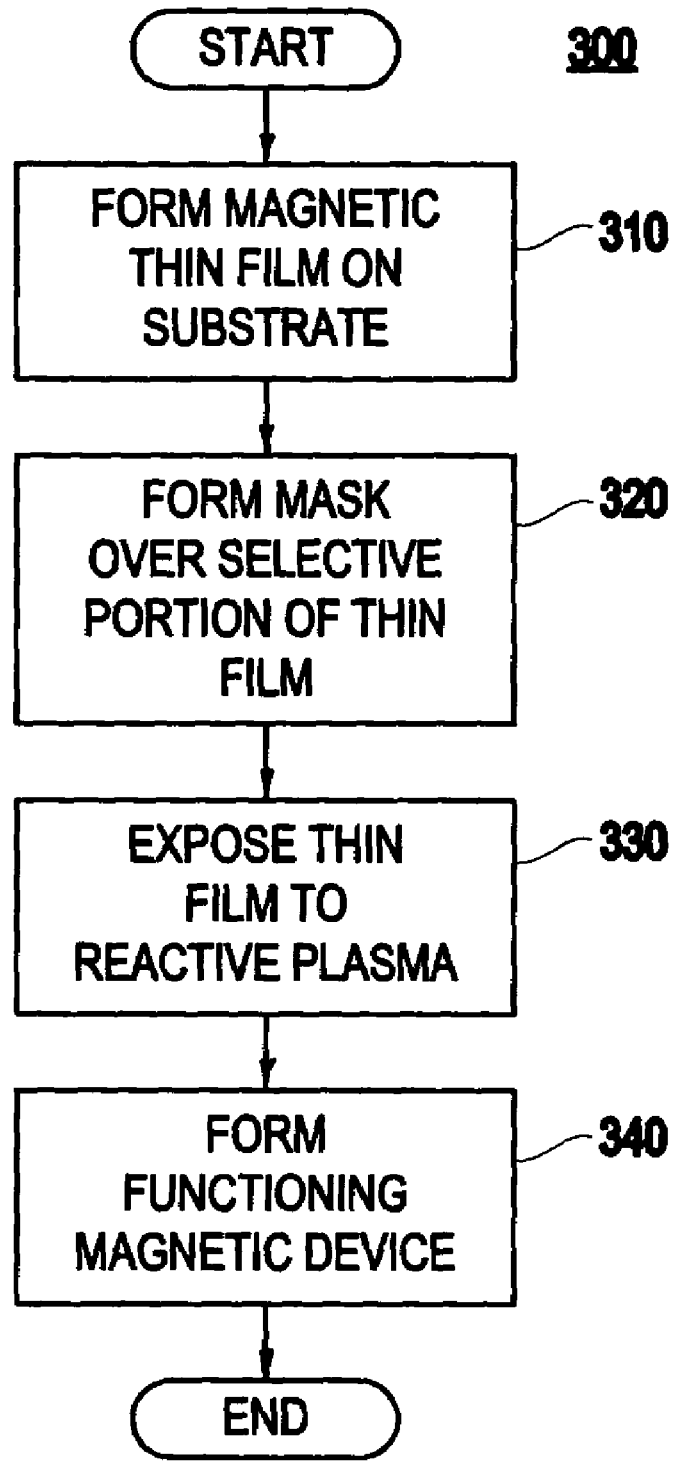
FIG. 3 illustrates a flowchart of a method 300 which corresponds to the processing steps shown in FIGS. 2A-2C.

Referring now to the drawings, and more particularly to FIGS. 1-4B, there are shown preferred embodiments of the method and structures according to the present invention.

Exemplary Embodiment

Turning now to FIG. 1 and an exemplary method (and structure formed by the method) of the invention will be described. Specifically, a method of patterning magnetic thin films (e.g., in the exemplary embodiment, a Permalloy™ thin film) which uses chemical transformation of the undesirable part of the film to transform it to be non-magnetic, will be described.

FIG. 1 illustrates a structure 100 in which a substrate 110 is provided. The substrate may be any suitable material (e.g., silicon, $SiO_2$, sapphire, etc.).

On a surface (e.g., the top surface) of the substrate 110, a magnetic film 120 (e.g., Permalloy™, alloys of nickel, iron, and cobalt, and any of a number of other magnetic alloy materials) is formed. Preferably, the thin film 120 has a thickness in a range of about 10 Å to about 50 Å, but of course the invention is not limited to such thicknesses and has scalability, as would be known by one of ordinary skill in the art taking the present application as a whole.

After the magnetic film 120 is formed, a mask 130 is placed over a selective portion of the magnetic film 120. Thereafter, the magnetic film is exposed to a reactive plasma 140. The exposure to the plasma can be advantageously performed at a relatively low temperature (e.g., at or near room temperature). That is, even though there may be some natural heating by virtue of the plasma, the inventive method need not heat the substrate or any other materials in the structure. Of course, heating may also provide advantages in the conversion process.

It is noted that fluorine is used in the exemplary embodiment in the reactive plasma, but other gases and materials also can be used advantageously.

For example, a variety of fluorocarbon plasmas with, for example, other gases present such as argon can be used, as well as sulfur hexafluoride, etc.

Additionally, a predetermined small amount (e.g., 5-10%) of bromide containing gases may be added to the flourine-based gas (e.g., $NF_3$, $CF_4$, $SF_6$, $CHF_3$, or the like, etc.). A main consideration for the plasma is that it converts the underlying thin magnetic film, as discussed above, while preserving film adhesion.

Thus, a preferred realization of the inventive technique would be to first use photolithographic techniques to provide the mask 130 on top of the magnetic thin film sample 120 in a conventional manner. This mask 130 is formed on the top of the magnetic thin film region to be preserved, and would be made in the usual fashion either relying on a photoresist as a mask material 120 and/or a hard mask patterned layer including diamond-like carbon (DLC), TiN, TaN, or similar materials. In this case, hard mask opening and conversion could be combined or be performed sequentially.

Regardless of the materials for the mask 130 selected, it is important that the mask be impervious to the plasma used in a subsequent plasma exposure step.

Conversion of the exposed portions of the magnetic film 120 is achieved by a low power plasma of, for example, $CF_4$, etc. For purposes of the present application, "low power" means that, at the power used, no significant removal of the material is expected to occur. At pressures and power selectively employed, the magnetic thin film material (e.g., Permalloy™, NiFe, etc.) will not be removed, but instead the magnetic thin film will be converted to a fluorine-containing film.

Some of the properties of the fluorinated layer of interest include that it is magnetically inactive (i.e., non-ferromagnetic), and electrically insulating. Additionally, the fluorinated layer is strongly adhering to the substrate below. That is, it does not peel upon stress experienced during the fabrication process. Thus, the risk of the fluorinated layer peeling-off, flaking-off or blowing-off of the substrate is minimal.

Subsequent processing can proceed in a known manner (e.g., as typically performed) to produce a functioning magnetic device. An example of such a structure is shown in FIGS. 2A-2C.

That is, FIG. 2A (e.g., showing the result of the above-described low power plasma exposure step) illustrates a structure 200 having a substrate 210 having a magnetic thin film.

Specifically, a patterned tunnel junction 220 is shown with a mask thereover 230. The magnetic thin film having been exposed to the reactive plasma (fluorine) is shown as a fluorinated Permalloy™ (Py) 250 on either side of the patterned tunnel junction 220. Preferably, the low power plasma exposure is performed at a pressure within a range of about 5 mT to about 100 mT, and more preferably about 10 mT to about 30 mT, and most preferably at about 20 mTorr. It is noted that optimum power is tool-specific, but a maximum power may be about 200 W.

FIG. 2B (e.g., showing the result of a passivation step) illustrates structure 200 having had an insulating layer (e.g., oxides such as $SiO_2$, nitrides such as SiN, SiC, SiLK™ (e.g., a dielectric resin polymer with a low dielectric constant used in insulating layers for semiconductor devices and manufactured by Dow Chemical Corporation) or the like; for exemplary purposes only, $SiO_2$ will be described hereinbelow and shown in FIG. 2B) formed over the fluorinated Py 250 and mask, and then a chemical mechanical polishing (CMP) could be performed to planarize the upper level of the mask and $SiO_2$ or the like.

FIG. 2C (e.g., showing the result of forming the contact) illustrates the structure 200 having had the mask 230 removed by selective etching or the like, and a conductive material is formed (e.g., metal, polysilicon, etc.; copper, tungsten, and aluminum with copper being the most preferable) over the insulating layer 260 and the area (e.g., via or plug) where the mask 230 was. Thus, the device is completed.

Regarding a preferred thickness of the layers above, the mask preferably has a thickness of about 200 Å to 1500 Å for the mask, and the metal preferably has a thickness of about 1000 Å to about 4000 Å.

FIG. 3 illustrates a flowchart of a method 300 which corresponds to the processing steps shown in FIGS. 2A-2C.

Specifically, in step 310, a substrate is provided with a magnetic thin film formed thereon.

In step 320, a mask is formed over a selective portion of the magnetic thin film.

In step 330, the magnetic film is exposed to a reactive plasma e.g., a fluorine or the like), thereby to convert the exposed portions of the magnetic film (e.g., a NiFe film or the like) exposed to the reactive plasma to a fluorine-containing film. The fluorine-containing film is magnetically inactive and electrically insulating.

In step 340, a functioning magnetic device can be formed (e.g., such as forming the contact on top of the structure formed in step 330).

With the present invention, a method (and resulting structure) are provided in which a 100% reduction of the moment is achieved. Thus, the invention can reduce the moment to 0.

Figure 4A:
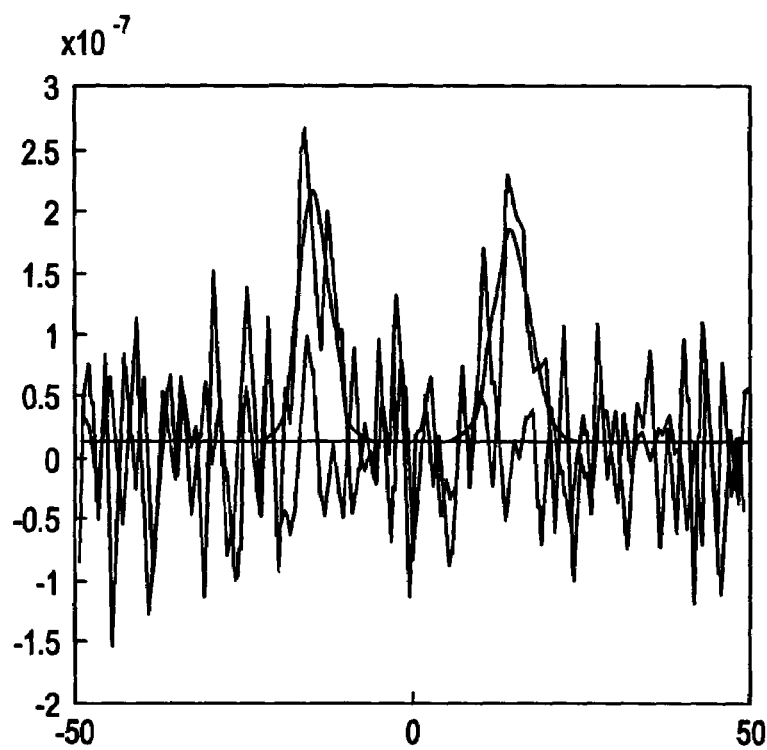
FIGS. 4A-4B illustrate plots showing the material's magnetic hysteresis loop.
Figure 4B:
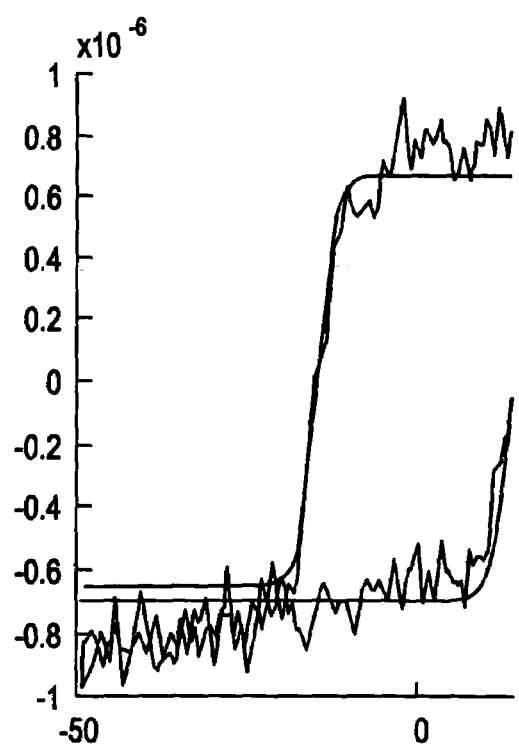

FIGS. 4A and 4B illustrate the hysteresis in magnetic patterning of a material according to the present invention, was completed on a sub-micron scale. That is, the good switching behavior is indicative of good patterning.

Thus, with the invention, the material exhibits a magnetic hysteresis loop as shown in FIGS. 4A and 4B, indicating from the magnitude of the moment and the relatively large switching field that magnetic patterning on a sub-micron scale was achieved.

Looking closer at FIGS. 4A and 4B, data from a magnetometer illustrates that a significant switching field exists advantageously over the hysteretic loop, thereby indicating isolated magnetic dots. Further, electrical measurements showed that the sample was insulating, an expected result given that the unprotected Permalloy™ film was converted to a fluorinated state as discussed above.

Additionally, atomic force microscope (AFM) images have shown that the surface (e.g., aside from the remaining hard mask material) is flat, so that patterning does not involve actual removal of material, but rather conversion from the pristine Permalloy™ to an insulating and non-magnetic material.

Thus, with the unique and unobvious features of the present invention, a significant improvement in current processing methods is provided due to the following considerations. That is, with the present invention, there is no exposure of the edges of the magnetic tunnel junction to oxygen.

Additionally, the edge is more sharply delineated with the present invention than in the case of either RIE or ion milling. The edge smoothness is most importantly determined by the photoresist line edge roughness, and not by the process itself.

Further, there is little topography following patterning so that subsequent fabrication is simplified.

While the invention has been described in terms of several preferred embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of patterning a magnetic thin film, comprising:
    transforming a portion of the magnetic thin film to be non-magnetic and electrically insulating using a chemical transformation, said chemical transformation comprises using a reactive plasma comprising a combination of a fluorine-based gas and a bromide-containing gas,
    wherein said reactive plasma includes 5% to 10% bromide,
    wherein said portion of said magnetic thin film comprises NiFe and said transforming comprises transforming said NiFe to a fluorine-containing film, and
    wherein said fluorine-containing film is electrically insulating.

2. The method of claim 1, further comprising:
    providing a mask over said portion of the magnetic thin film to be preserved using photolithography.

3. The method of claim 1, wherein said fluorine-based gas comprises any of $NF_3$, $CF_4$, $SF_6$, and $CHF_3$.

4. The method of claim 1, wherein a pressure used in said transforming is within a range of about 10 mT to about 30 mT.

5. The method of claim 2, wherein said mask comprises a photoresist.

6. The method of claim 2, wherein said mask comprises a hard mask patterned layer comprising one of diamond-like carbon (DLC), TiN, and TaN.

7. The method of claim 1, wherein said using said chemical transformation is performed at room temperature.

8. The method of claim 1, wherein said reactive plasma includes a fluorocarbon.

9. The method of claim 1, wherein said reactive plasma includes sulfur hexafluoride.

10. The method of claim 1, wherein a pressure is selectively employed for said plasma sputtering such that the magnetic thin film material is substantially free of erosion.

11. The method of claim 2, further comprising:
    forming an insulating layer over the converted portion of said magnetic thin film and said mask; and
    etching said insulating layer and said mask to planarize an upper level of the mask and the insulating layer.

12. The method of claim 11, further comprising:
    selectively etching said mask; and
    forming a conductive material over the insulating layer and an area where the mask was selectively etched.

13. The method of claim 2, wherein said mask comprises an insulating hard mask, said method further comprising:
    after said converting, selectively etching said insulating hard mask to remove said insulating hard mask.

14. The method of claim 13, further comprising:
    forming a conductive material over an area where the insulating hard mask was etched.

15. The method of claim 1, wherein said magnetic thin film includes a magnetic tunnel junction (MTJ), and
    wherein after said converting said portion, edges of the magnetic tunnel junction have no exposure to oxygen.

16. The method of claim 15, wherein an edge smoothness of the MTJ is determined by a line edge roughness of the mask.

17. The method of claim 1, wherein a pressure used in said transforming is substantially 20 mT.

* * * * *